United States Patent
Padmanabhan et al.

(10) Patent No.: US 9,048,214 B2
(45) Date of Patent: Jun. 2, 2015

(54) BIDIRECTIONAL FIELD EFFECT TRANSISTOR AND METHOD

(75) Inventors: Balaji Padmanabhan, Tempe, AZ (US); Prasad Venkatraman, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 74 days.

(21) Appl. No.: 13/590,947

(22) Filed: Aug. 21, 2012

(65) Prior Publication Data

US 2014/0054682 A1 Feb. 27, 2014

(51) Int. Cl.
*H01L 29/66* (2006.01)
*H01L 29/40* (2006.01)
*H01L 29/78* (2006.01)
*H01L 29/423* (2006.01)

(52) U.S. Cl.
CPC ............ *H01L 29/404* (2013.01); *H01L 29/407* (2013.01); *H01L 29/42368* (2013.01); *H01L 29/66734* (2013.01); *H01L 29/7813* (2013.01)

(58) Field of Classification Search
CPC .. H01L 29/4236; H01L 29/407; H01L 29/423
See application file for complete search history.

(56) References Cited

U.S. PATENT DOCUMENTS

| 6,191,447 B1* | 2/2001 | Baliga ............................ 257/330 |
| 7,282,406 B2 | 10/2007 | Grivna | |
| 7,915,672 B2 | 3/2011 | Venkatraman | |
| 8,334,564 B2* | 12/2012 | Hirler et al. .................... 257/328 |
| 8,362,550 B2* | 1/2013 | Rexer et al. ..................... 257/330 |
| 2010/0214016 A1* | 8/2010 | Blanchard et al. ............ 327/574 |
| 2010/0258866 A1* | 10/2010 | Pan .................................. 257/330 |
| 2010/0264486 A1* | 10/2010 | Denison et al. ................ 257/330 |
| 2012/0261714 A1* | 10/2012 | Taketani et al. ................ 257/139 |

OTHER PUBLICATIONS

Francine Robb, A New P-channel Bidirectional Trench Power MOSFET for Battery Charging and Protection, Proceedings of The 22nd International Symposium on Power Semiconductor Devices & IC, Hiroshima, pp. 405-408.

* cited by examiner

*Primary Examiner* — Benjamin Sandvik
(74) *Attorney, Agent, or Firm* — Daniel J. Anderson

(57) ABSTRACT

In one embodiment, a structure for a semiconductor device has trench shield electrodes formed above and below a gate electrode. The structure can be configured to function as a bidirectional power field effect transistor.

11 Claims, 14 Drawing Sheets

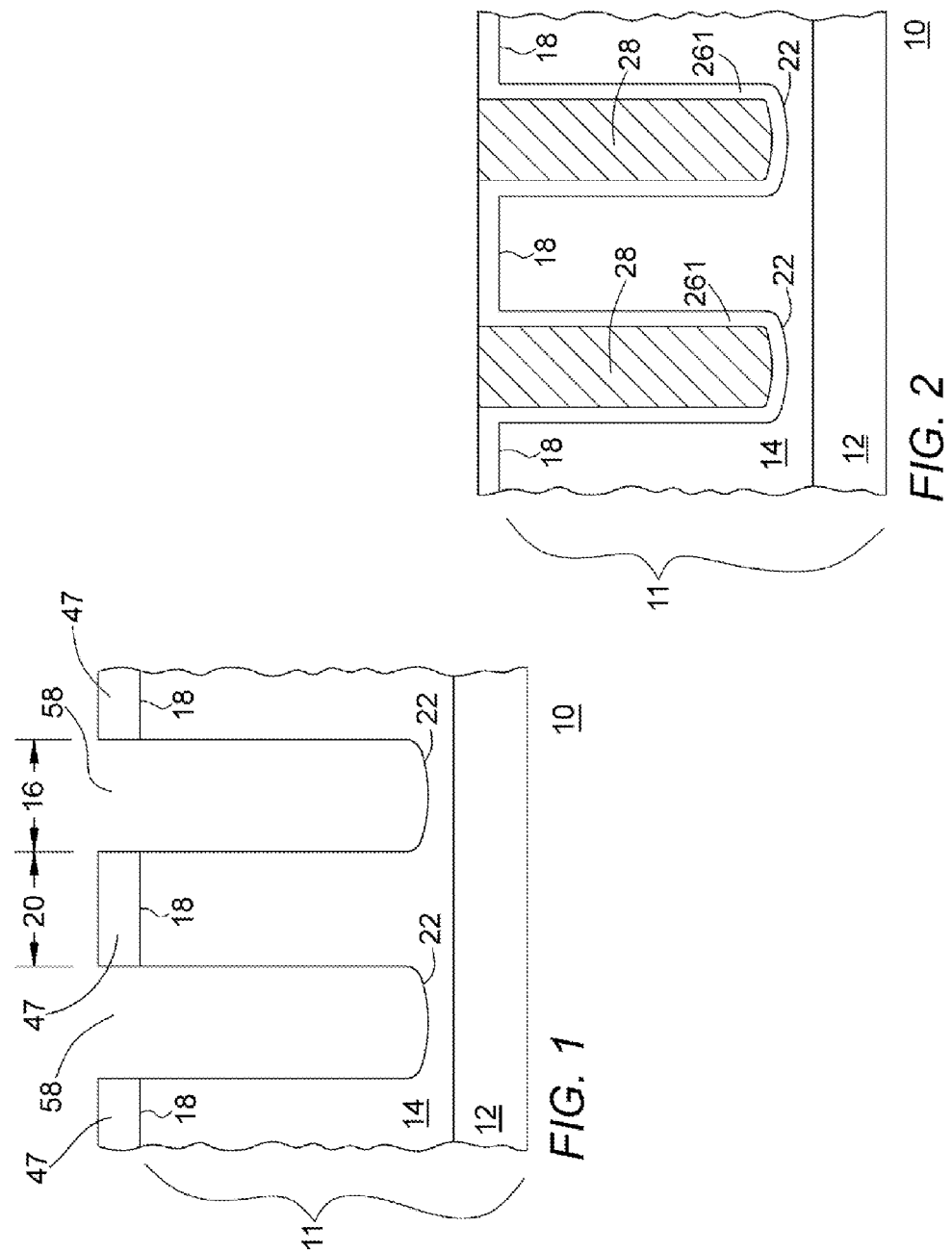

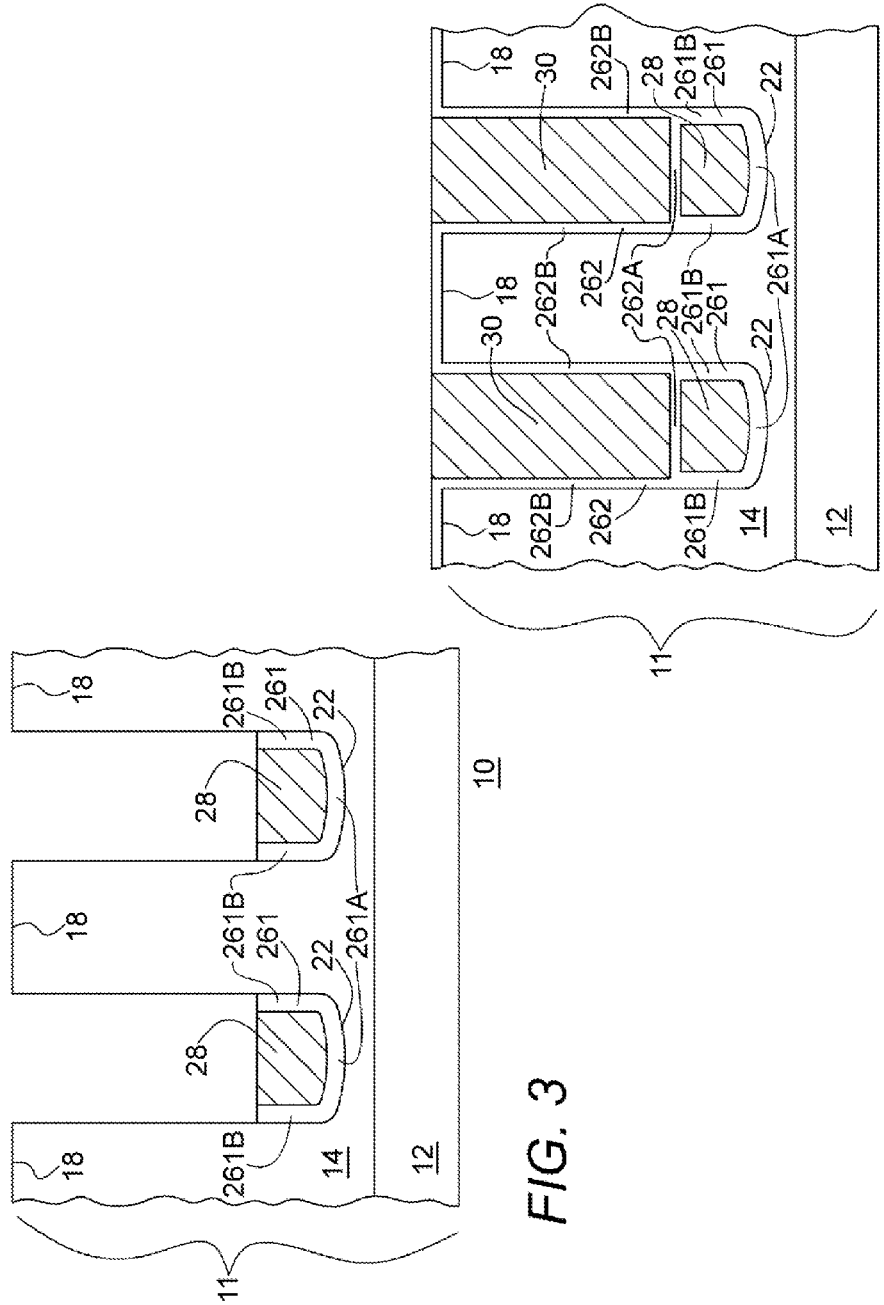

BIDIRECTIONAL FIELD EFFECT TRANSISTOR AND METHOD

BACKGROUND

This document relates generally to semiconductor devices, and more specifically to field effect transistor (FET) structures and methods of manufacture.

Electronic systems, including portable electronic systems, are typically powered by various combinations of power sources. Some of these power sources have included one or multiple batteries and AC wall outlets via an ac/dc converter or battery charger. Users of electronic systems expect safeguards to prevent damage to the internal electronics of the system in the event of reverse battery installation, incorrect converter or charger installation, accidental short circuiting, and other forms of inappropriate operation. In order to protect the electronic system from such damage occurring, some manufacturers of conventional switches have incorporated varying networks of switches to control the flow of power within the system. As an example, if a conventional switch system was powered from a primary battery while a secondary battery was charged, some switches were closed while other switches were open. In another mode, the switches may have been reversed. These networks of switches have typically been comprised of power metal oxide semiconductor field effect transistors (power MOSFETs). To be effective in all modes, the network of switches generally conduct and block in both directions. However, power MOSFETs can only block voltage in one direction. Thus, in order to ensure reverse current flow and reverse bias voltage are low enough to prevent damage to the system, two power MOSFETs are typically connected in series to function as one switch. The two power MOSFETs typically are used with their drains tied together so that when the gate voltage is zero, at least one of the devices blocks the voltage applied across the two transistors regardless of the polarity. A major downside to this setup is that the back-to-back power MOSFET series arrangement doubles both the on-resistance and chip area of the device thereby quadrupling the specific on-resistance of the device.

Accordingly, it is desirable to have a monolithic bidirectional switch that reduces on-resistance and is cost effective to manufacture.

BRIEF DESCRIPTION OF THE DRAWINGS

FIGS. 1-9 illustrate partial cross-sectional views of a semiconductor device at various stages of fabrication in accordance with a first embodiment of the present invention;

Figure 5:
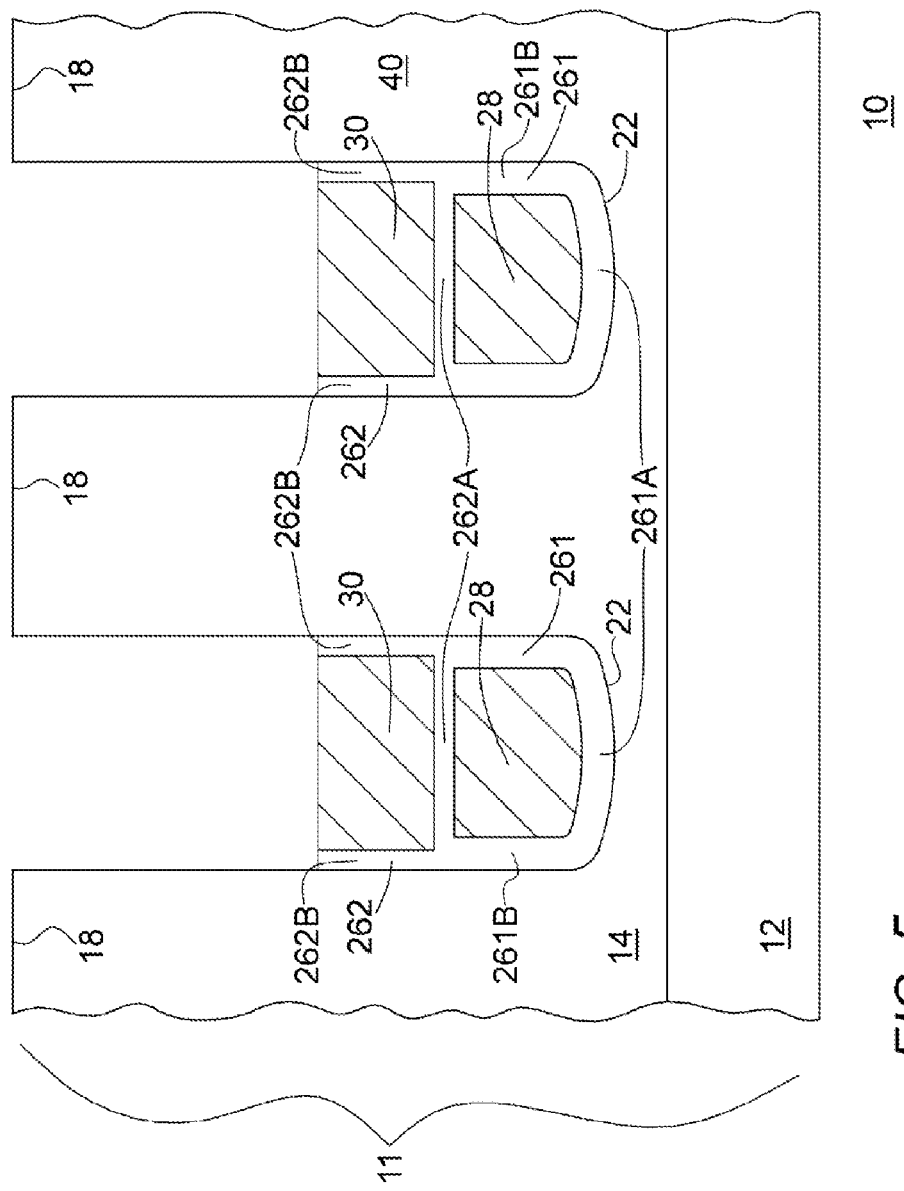

For simplicity and clarity of illustration, elements in the figures are not necessarily drawn to scale, and the same reference numbers in different figures denote generally the same elements. Additionally, descriptions and details of well-known steps and elements may be omitted for simplicity of the description. As used herein current-carrying electrode means an element of a device that carries current through the device such as a source or a drain of an MOS transistor, an emitter or a collector of a bipolar transistor, or a cathode or anode of a diode, and a gate electrode means an element of the device that controls current through the device such as a gate of a MOS transistor.

Although the devices are explained herein as certain N-channel devices, a person of ordinary skill in the art understands that P-channel devices and complementary devices are also possible in accordance with the present description. For clarity of the drawings, doped regions of device structures are illustrated as having generally straight-line edges and precise angular corners. However, those skilled in the art understand that due to the diffusion and activation of dopants, the edges of doped regions are generally not straight lines and the corners are not precise angles.

Furthermore, the term "major surface" when used in conjunction with a semiconductor region or substrate means the surface of the semiconductor region or substrate that forms an interface with another material, such as a dielectric, an insulator, a conductor, or a polycrystalline semiconductor. The major surface can have a topography that changes in the x, y and z directions.

In addition, structures of the present description may embody either a cellular base design (where the body regions are a plurality of distinct and separate cellular or stripe regions) or a single base design (in which the body region is a single region formed in an elongated pattern, typically in a serpentine pattern or a central portion with connected appendages). However, one embodiment of the present description will be described as a cellular base design throughout the description for ease of understanding. It should be understood that the present disclosure encompass both a cellular base design and a single base design.

DETAILED DESCRIPTION OF THE DRAWINGS

In general, the present description pertains to a semiconductor device configuration of a bidirectional trench field effect transistor having a plurality of gate electrodes and a plurality of shield electrodes. In various embodiments, the gate electrodes are insulated from their nearest shield electrodes. In these embodiments, the plurality of gate electrodes can be connected together using a control structure, control pad, and control runners. Additionally, the plurality of shield electrodes can be connected together using shield electrode runners. In various embodiments, the configuration utilizes a single metal layer to achieve the various connections and places a shield electrode contact in a location that is offset from a center portion of the device. In various alternative embodiments, the gate electrodes and shield electrodes can be connected together to form a single electrical structure.

FIG. 1 illustrates a partial cross-sectional view of a semiconductor device 10 or cell 10 at an early stage of fabrication in accordance with a first embodiment. Device 10 includes a region of semiconductor material, semiconductor material, or semiconductor region 11, which can comprise, for example, an n-type silicon substrate 12 having a resistivity ranging from 0.001 ohm-cm to about 0.005 ohm-cm. Substrate 12 can be doped, for example, with phosphorous, arsenic or antimony. In the embodiment shown, substrate 12 provides a drain region, drain contact, or a first current carrying contact for device 10. Also, in this embodiment, device 10 is shown configured as a vertical power MOSFET structure, but this description applies as well to other MOS devices.

A semiconductor layer, drift region, or semiconductor region 14 can be formed, in, on, or overlying substrate 12. In one embodiment, semiconductor layer 14 can be formed using semiconductor epitaxial growth techniques. These techniques may comprise a single epitaxial layer or multiple epitaxial layers. Alternatively, semiconductor layer 14 can be formed using semiconductor doping and diffusion techniques, for example, ion implantation or thermal diffusion. In an embodiment suitable for a 20-30 V device, semiconductor layer 14 can be n-type with a dopant concentration of about $1.0 \times 10^{16}$ to about $5.0 \times 10^{17}$ atoms/cm$^3$, and can have a thickness from about 3 microns to about 7 microns. In an alternative embodiment, the dopant concentration of semiconductor layer 14 varies vertically from about $1.0 \times 10^{17}$ atoms/cm$^3$ at a lower surface of semiconductor layer 14 to about $1.0 \times 10^{16}$ atoms/cm$^3$ at a midpoint of the semiconductor layer 14 to about $1.0 \times 10^{17}$ atoms/cm$^3$ at an upper surface of the semiconductor layer 14. The thickness and dopant concentration of semiconductor layer 14 can be increased or decreased depending on the desired drain-to-source breakdown voltage ($BV_{DSS}$) rating of device 10.

A masking layer 47 can be formed overlying a major surface 18 of region of semiconductor material 11. In one embodiment, masking layer 47 can comprise a dielectric film or a film resistant to etch chemistries used to form trenches 22 described hereinafter. In one embodiment, masking layer 47 can comprise about 0.10 to 1.0 microns of thermal oxide. Openings 58 can then be formed in masking layer 47. In one embodiment, photoresist and etch processes can be used to form openings 58. In one embodiment, openings 58 can have an initial width 16 of about 0.1 microns to about 1.0 microns. In one embodiment, an initial spacing 20 between openings 58 can be about 0.2 microns to about 2.0 microns.

After openings 58 are formed, segments of semiconductor layer 14 can be etched to form trenches 22 extending from major surface 18. By way of example, trenches 22 can be formed using plasma etching techniques with a fluorocarbon chemistry (e.g. $SF_6/O_2$). In one embodiment, the depth of trenches 22 can be about 3 microns to about 6 microns.

FIG. 2 illustrates a partial cross-sectional view of device 10 after additional processing. In an optional step, a sacrificial layer (not shown) is formed adjoining surfaces of trenches 22. By way of example, the sacrificial layer may be grown as a thermal silicon oxide layer. Next, the sacrificial layer and masking layer 47 can be removed. In accordance with the present embodiment, a layer of material can then be formed overlying surfaces of trenches 22 and a major surface 18, which forms dielectric layer, shield layer, shield dielectric layer, or shield oxide 261 in trenches 22. By way of example, shield layer 261 typically comprises oxides, nitrides, tantalum pentoxide, barium strontium titanate, dielectrics, high-k dielectrics, combinations thereof, or other related or equivalent materials. In one embodiment suitable for a 30 V device, shield layer 261 can comprise silicon oxide and can have a thickness from about 0.05 microns to about 0.25 microns. The thickness of shield layer 261 can be made thicker for higher voltage devices.

Next, a layer of polycrystalline semiconductor material can be formed overlying major surface 18 and within trenches 22. In one embodiment, the layer of polycrystalline material can comprise doped polysilicon. This doping may occur in-situ or during a subsequent step. In one embodiment, the polysilicon can be doped with phosphorous. In a subsequent and optional step, the layer of polycrystalline material can be planarized. In one embodiment, chemical mechanical polishing (CMP) techniques can be used. The planarized material can then be heat treated or annealed. In one embodiment, the planarized material forms shield electrodes 28 for device 10.

FIG. 3 illustrates a partial cross-sectional view of device 10 after additional processing. The planarized material used to form shield electrodes 28 is further removed to recess the material by about 2 microns to 5 microns. As an example, a fluorine or chlorine based chemistry can be used for the recessing step. Next, portions of shield layer 261 overlying major surface 18 and portions of shield layer 261 overlying the trench surface walls can be removed. In one embodiment, the shield layer 261 overlying trench walls may be removed so as to recess shield layers 261 to about the same depth as the planarized material used to form shield electrodes 28. Shield layers 261 are comprised of lower portions 261A and side portions 261B. It is not a limitation of the current invention that shield layers 261 be formed from a single step, or that they be comprised of a single material. For example, in an alternate embodiment, lower portions 261A of shield layers 261 can be formed of one material in a first step or series of steps, while side portions 261B of shield layers 261 can be formed with a different material during a subsequent step or series of steps. Furthermore, lower portions 261A of shield layers 261 can have a thickness which is different than the thickness of side portions 261B of shield layer 261.

FIG. 4 illustrates a partial cross-sectional view of device 10 after additional processing. In accordance with the present embodiment, a layer of material can be formed overlying surfaces of trenches 22, shield electrodes 28, and major surface 18. This material can form gate layer or gate dielectric layer 262. By way of example, gate layer 262 typically comprises oxides, nitrides, tantalum pentoxide, barium strontium titanate, high-k dielectrics, combinations thereof, or other related or equivalent materials. In one embodiment, gate layer 262 can comprise silicon oxide and can have a thickness from about 0.01 microns to about 0.12 microns. By way of example, gate layer 262 can be thermally grown, deposited, or formed by other related or equivalent methods or combinations thereof. It is noted that the silicon oxide may grow at different rates depending on whether the silicon oxide is growing over a polysilicon region or a silicon substrate. In accordance with the present embodiment, lower portions 262A of gate layer 262 overlying shield electrodes 28 can be thicker or thinner than side portions 262B of gate layer 262 overlying trench walls and major surface 18. Next, a conductive layer or a polycrystalline semiconductor layer can be formed overlying major surface 18 and within trenches 22. In one embodiment, the conductive layer can comprise doped polysilicon. This doping can occur in-situ or during a subsequent step. In one embodiment, the polysilicon can be doped with phosphorous. Next, the conductive layer can be planarized. In one embodiment, the conductive layer can be planarized using CMP techniques. The planarized conductive layer forms gate electrodes 30 in trenches 22.

FIG. 5 illustrates a partial cross-sectional view of device 10 after additional processing. The planarized conductive layer used to form gate electrodes 30 is further removed to recess the material by about 1 micron to 4 microns below, for example, major surface 18. As an example, a fluorine or chlorine based chemistry can be used for recessing gate electrodes 30. Next, gate layer 262 overlying major surface 18 and portions of gate layer 262 overlying the trench surface walls can be removed. The portion of gate layer 262 overlying trench walls can be removed so as to recess gate layer 262 to about the same depth as the planarized conductive layer used to form gate electrodes 30. In an alternative embodiment, gate layer 262 can be left in place and not removed and oxide will be grown or deposited over it in later steps. In one embodiment, gate layers 262 are comprised of lower portions 262A and side portions 262B. It is not a limitation of the current invention that all portions of gate layers 262 be formed in a single step or that they be comprised of the same material. For example, in an alternate embodiment, lower portions 262A of gate layers 262 may be formed of one material in a first step or series of steps, while side portions 262B of gate layers 262 may be formed with a different material during a subsequent step or series of steps. Furthermore, lower portions 262A of gate layers 262 can have a thickness that is different than the thickness of side portions 262B of gate layers 262.

Figure 6:
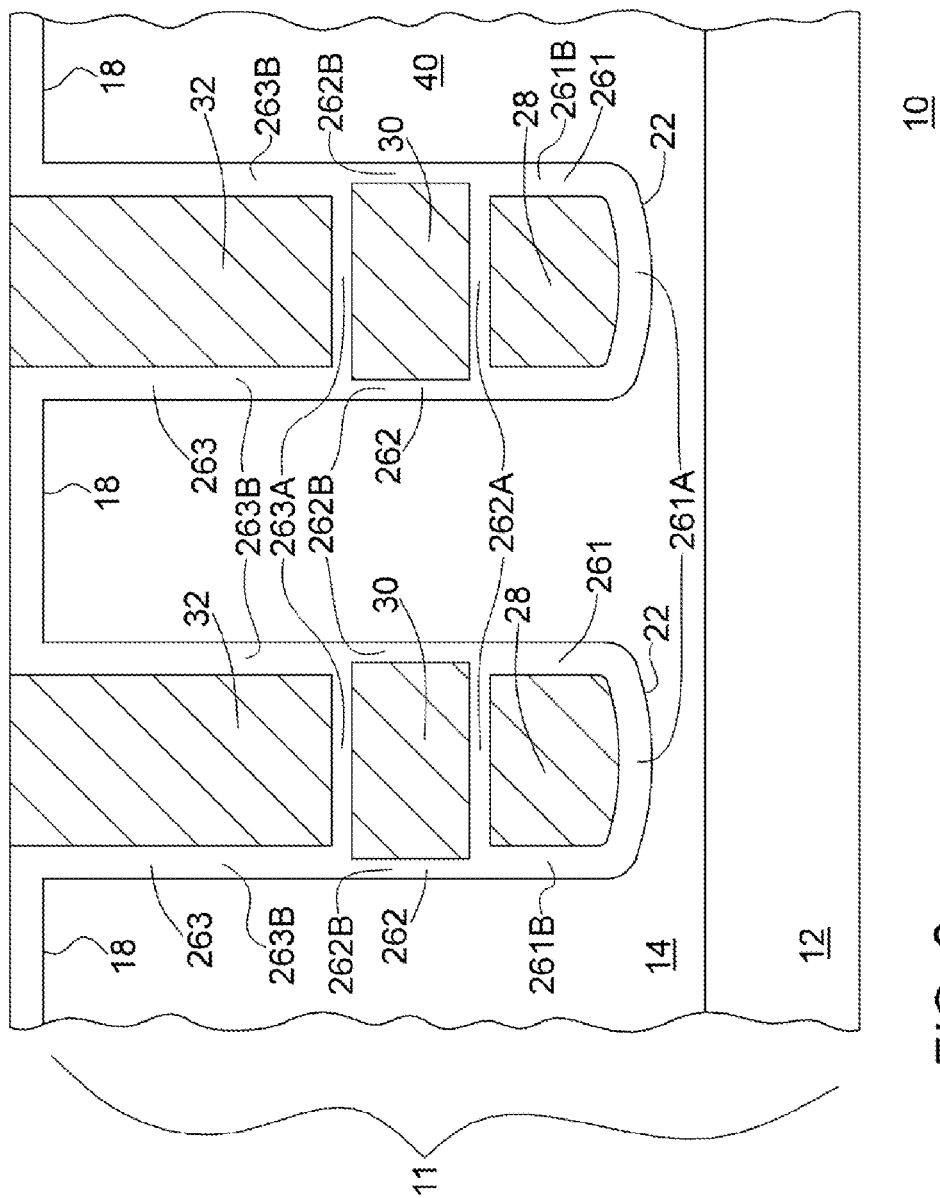

FIG. 6 illustrates a partial cross-sectional view of device 10 after additional processing. In accordance with the present embodiment, a layer of material can be formed overlying surfaces of trenches 22, gate electrodes 30, and major surface 18. This material forms shield layer 263. By way of example, shield layer 263 typically comprises oxides, nitrides, tantalum pentoxide, barium strontium titanate, high-k dielectrics, combinations thereof, or other related or equivalent materials. In one embodiment, shield layer 263 can comprise silicon oxide and can have a thickness from about 0.05 microns to about 0.25 microns. It is noted that silicon oxide may grow at different rates depending on whether the silicon oxide is growing over a polysilicon region or a silicon substrate. In another embodiment, shield layer 263 can comprise a deposited silicon oxide layer. In accordance with the present embodiment, lower portions 263A of shield layer 263 overlying gate electrodes 30 can be thinner or thicker than side portions 263B of shield layer 263 covering trench walls and major surface 18. Next, a conductive layer or a polycrystalline semiconductor layer can be formed overlying major surface 18 and within trenches 22. In one embodiment, the conductive layer can comprise doped polysilicon. In one embodiment, the polysilicon can be doped with phosphorous.

Next, the conductive layer can be planarized. In one embodiment, the conductive layer can be planarized using CMP techniques. The planarized conductive layer forms shield electrodes 32 in trenches 22. In one embodiment, layers 263 and 261 can be thicker than layer 262. It is not a limitation of the current invention that shield layers 263 be formed from in a single step or that they be comprised of a single material. For example, in an alternate embodiment, lower portions 263A of shield layers 263 can be formed of one material in a first step or series of steps, while side portions 263B of shield layers 263 can be formed with a different material during a subsequent step or series of steps. Furthermore, lower portions 263A of shield layers 263 can have a thickness that is different than the thickness of side portions 263B of shield layers 263.

Figure 7:
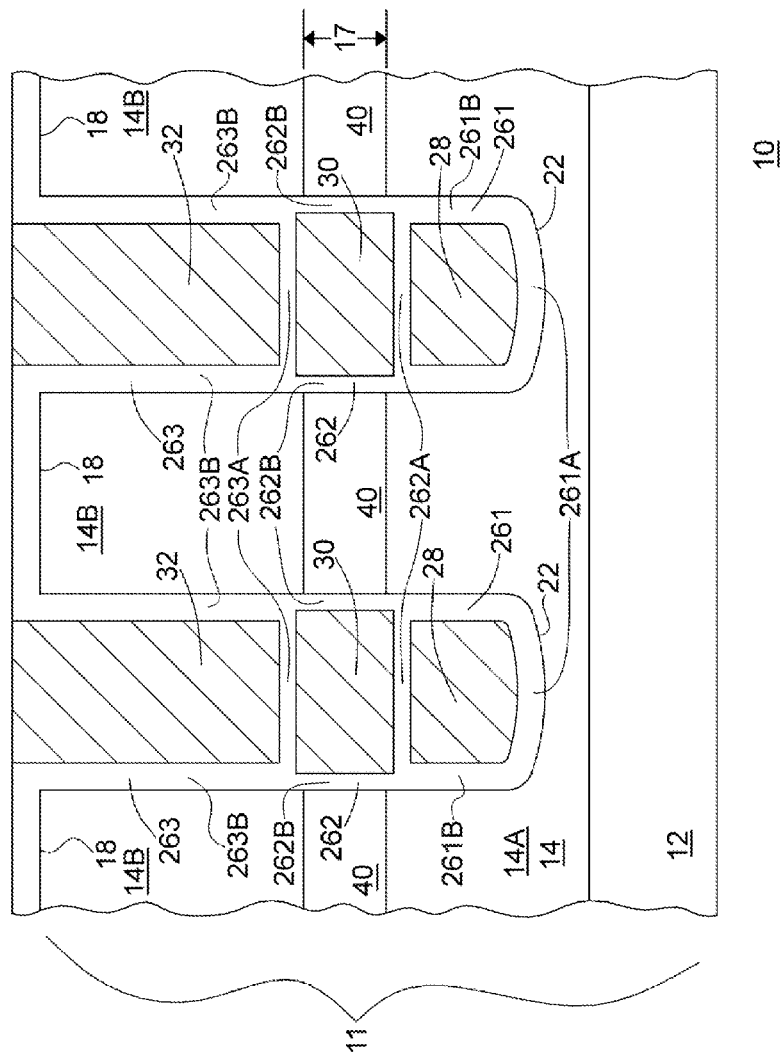

FIG. 7 illustrates a partial cross-sectional view of device 10 after additional processing. In one embodiment a masking layer (not shown) can be formed overlying portions of major surface 18, and body, base, or doped regions 40 can be formed within semiconductor layer 14. In one embodiment, body regions are formed laterally adjacent to gate electrodes 30 and are not laterally adjacent to either shield electrodes 28 or 30. Body regions 40 can have a conductivity type that is opposite to the conductivity type of semiconductor layer 14. Body regions 40 can have a dopant concentration suitable for forming inversion layers that operate as conduction channels or channel regions of transistor 10. Body regions 40 can vary in height 17 from about 0.1 microns to about 1 micron. It is understood that body regions 40 can also be formed at an earlier stage of fabrication, for example, before trenches 22 are formed. Body regions 40 can be formed using doping techniques, such as ion implantation and anneal techniques. Depending on the depth and height desired for body regions 40, the ion implantation dose may range from about $1\times10^{12}$ atoms/cm$^3$ to about $1\times10^{14}$ atoms/cm$^3$ at an energy level of about 300 keV to about 2 MeV. Subsequent to the ion implantation, device 10 may be annealed at a temperature of about 850 degrees Celsius (° C.) to about 1100 degrees Celsius (° C.) for about 20 minutes to about 60 minutes. In another embodiment, a rapid thermal anneal (RTA) process can be used at a temperature of about 900 degrees Celsius (° C.) to about 1100 degrees Celsius (° C.) for about 10 seconds to about 120 seconds. Alternatively, body regions 40 can be grown as an epitaxial layer or epitaxial layers within semiconductor layer 14 during the formation of semiconductor layer 14.

In one embodiment, body regions 40 can be electrically grounded or electrically connected to a reference potential in another portion of device 10 (not shown) during subsequent process steps. In another embodiment, body regions 40 can be left floating. In another embodiment, a diffused region or sinker, of the same conductivity type as body regions 40, can be used to electrically connect body regions 40 to a body electrode on the surface of device 10 at one or more locations along the length of trench 22. This body electrode may be biased by connecting it to an external control circuit. Alternatively, the body electrode may be biased by connecting it to a control circuit that is monolithically integrated along with device 10.

In one embodiment, body regions 40 separate semiconductor layer 14 into upper portions 14B of semiconductor layer 14 and lower portions 14A of semiconductor layer 14. In accordance with the present embodiment, portions 14A and 14B are configured alternatively as source or drain regions for device 10 depending on bias conditions applied to device 10 as described later.

Figure 8:
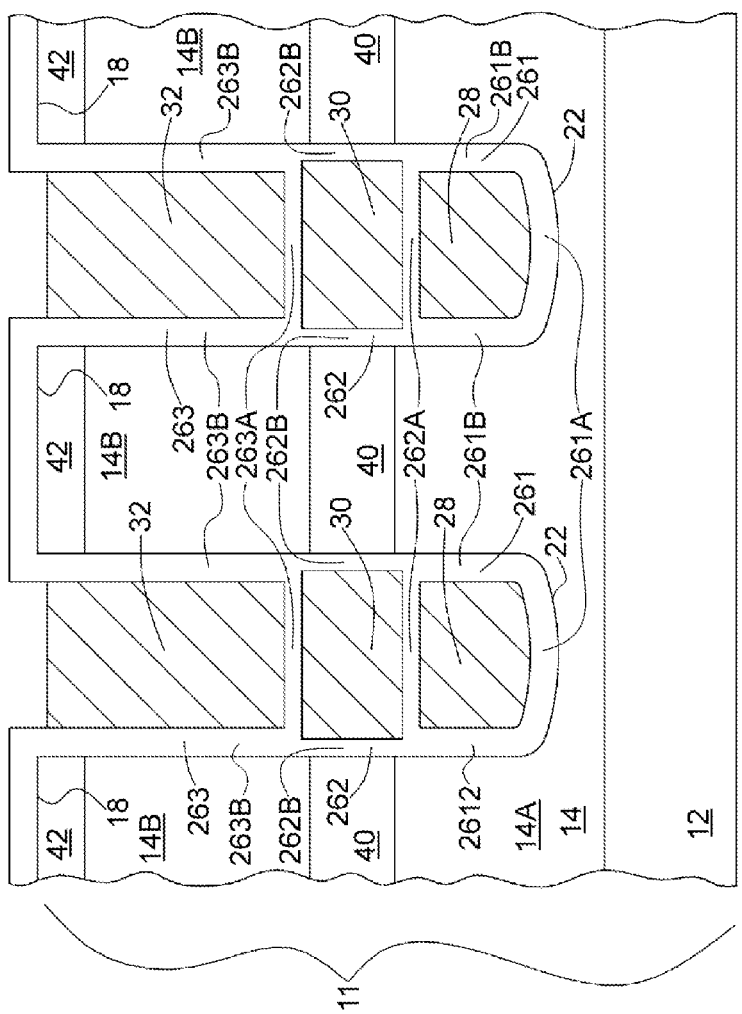

FIG. 8 illustrates a partial cross-sectional view of device 10 after additional processing. Optionally, the planarized material used to form shield electrodes 32 can be further removed to recess the material to about 0.005 microns to 0.25 microns below major surface 18. As an example, a fluorine or chlorine based chemistry can be used for the recessing step. Next, in one embodiment a masking layer (not shown) can be formed overlying portions of major surface 18, and a contact region or regions 42 can be formed within semiconductor layer 14. Contact regions 42 can have a conductivity type that is the same conductivity type of semiconductor layer 14. Contact regions 42 can have a dopant concentration suitable for forming low resistance contact areas. Contact regions 42 can vary in depth from about 0.1 microns to about 0.5 microns below major surface 18. It is understood that contact regions 42 can also be formed at an earlier stage of fabrication, for example, before trenches 22 are formed. Contact regions 42 can be formed using doping techniques, such as ion implantation and anneal techniques. Depending on the depth and height desired for contact regions 42, the ion implantation dose may range from about $1 \times 10^{15}$ ions/cm$^2$ to about $8 \times 10^{15}$ ions/cm$^2$ at an energy level of about 10 keV to about 150 keV. Subsequent to the ion implantation, device 10 can undergo rapid thermal annealing at a temperature of about 850 C to about 1100 C for about 10 seconds to about 120 seconds. Alternatively, contact regions 42 can be grown as an epitaxial layer or epitaxial layers within semiconductor layer 14 during the formation of semiconductor layer 14.

Figure 9:
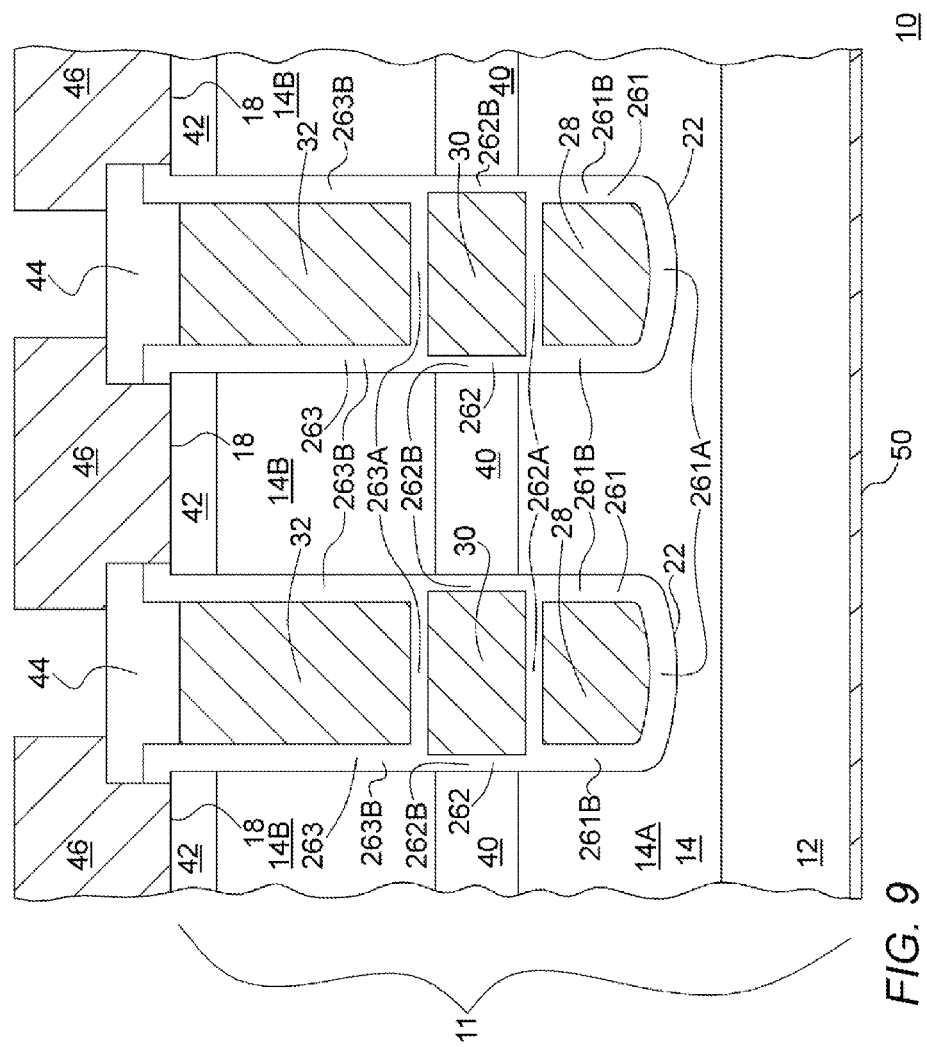

FIG. 9 illustrates a partial cross-sectional view of device 10 after additional processing. In accordance with the present embodiment, a layer of material 44 can be formed overlying major surface 18, shield layer 263, shield electrodes 32 and contact regions 42. In one embodiment, layer 44 is an interlayer dielectric (ILD) and can comprise deposited oxide, silicon nitride, or a polyimide film. In one embodiment, the ILD may have a thickness of about 0.3 microns to about 2.0 microns. Next, a masking layer (not shown) can be formed overlying portions of major surface 18 and ILD 44, and ILD 44 can be etched to expose portions of contact regions 42. Next, a masking layer (not shown) can be formed overlying device 10, and openings, vias, or contact trenches can be formed through portions of shield layer 263 for making contact to contact regions 42. Finally, conductive regions, source/drain electrodes, or upper electrodes 46 can be formed through the openings in layers 44 and 263 to provide electrical contact to contact regions 42. In one embodiment prior to forming upper electrodes 46, a wet dielectric contact widening etch can be used, which opens up the contacts in certain regions. In subsequent process steps, silicon substrate 12 can be thinned and conductive metal layer, source/drain electrode, or lower electrode 50 can be formed adjoining substrate 12. In one embodiment, lower electrode 50 can comprise titanium, silver, nickel, or other related or equivalent materials.

In one embodiment, conductive regions or upper electrodes 46 can be conductive plugs or plug structures. In one embodiment, upper electrodes 46 can comprise a conductive barrier structure or liner plus a conductive fill material. In one embodiment, the barrier structure can include a metal/metal-nitride configuration, such as titanium/titanium-nitride, a metal-silicide structure, or other related or equivalent barrier structure materials. In one embodiment, the conductive fill material includes tungsten or other related or equivalent materials. In one embodiment, upper electrodes 46 can be planarized to provide a more uniform topography.

Figure 10:
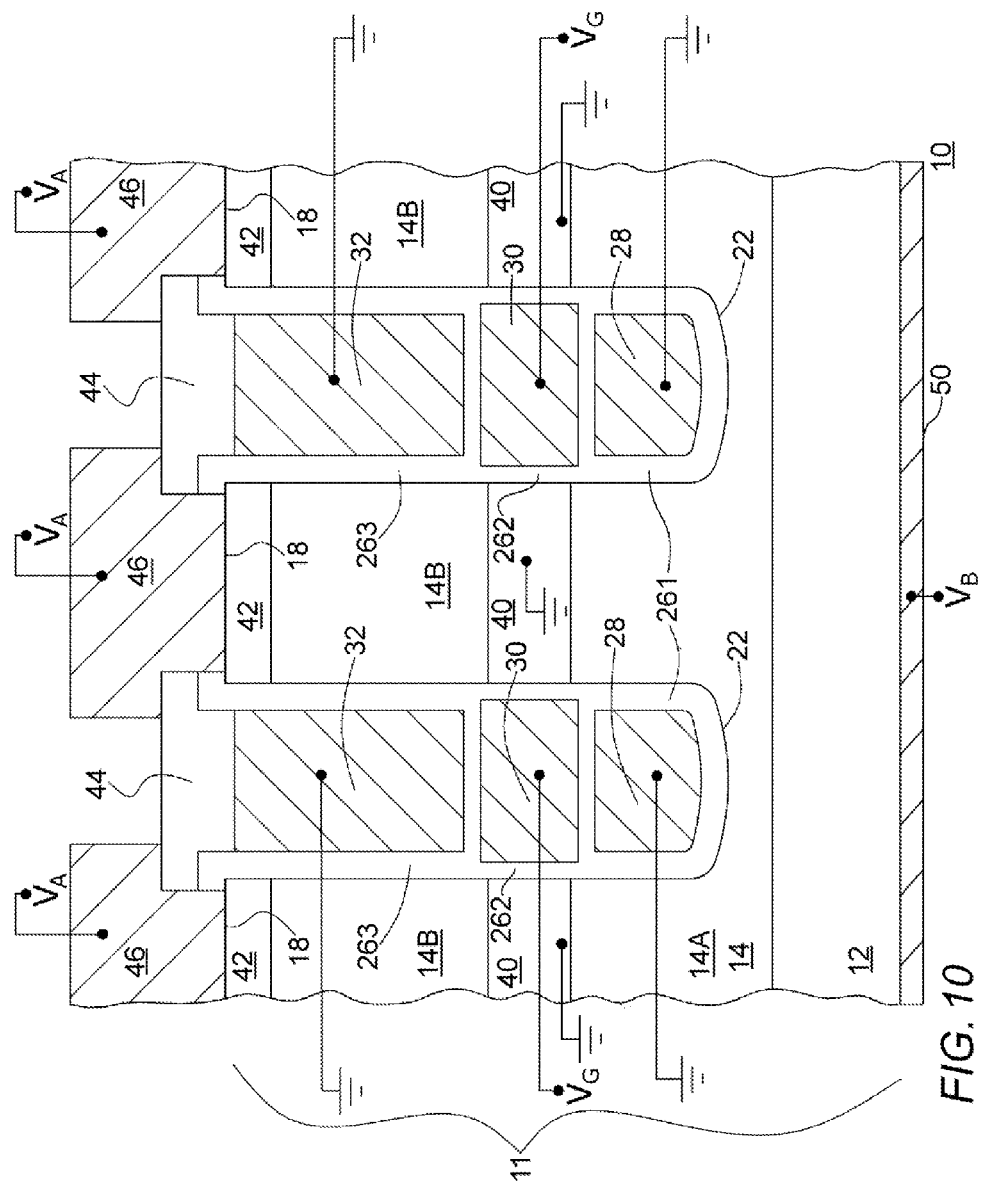
FIG. 10 illustrates a partial cross-sectional view of an alternative embodiment of a semiconductor device at a stage of fabrication in accordance with a second embodiment of the present invention.

Referring now to FIG. 10, in one embodiment, the operation of device 10 can proceed as follows. Shield electrodes 28 and 32 and body regions 40 can be held at a ground potential or a reference potential for device 10. In an alternative embodiment, body regions 40 can be left at a floating potential. In this bias condition, device 10 is configured to conduct or block current in two directions depending on the relative voltage values of voltages designated as $V_A$, $V_B$, and $V_G$ in FIG. 10.

In a first example, a voltage $V_G$ can be applied to gate electrodes 30. The value of voltage $V_G$ can be chosen such that upon application of $V_G$ to gate electrodes 30, inversion layers are formed in portions of body regions 40 adjacent to gate layers 262. Under this condition, gate electrodes 30 are said to be turned "on". Upper electrodes 46 can be held at a voltage $V_A$, wherein $V_A$ is substantially equal to the ground potential or the reference potential for device 10. A voltage $V_B$ can be applied to lower electrode 50. As an example, voltage $V_B$ can be approximately 30V above the ground potential or the reference potential for device 10. Body regions 40 can be held at the ground potential. Alternatively, body regions 40 can be held at a voltage substantially equal to $V_A$ by connecting the body electrode to a control circuit, which electrically connects it to upper electrode 46. Under this first example, device 10 can conduct a current from lower electrode 50 to upper electrodes 46.

In a second example, gate electrodes 30 can be held at a voltage $V_G$, wherein $V_G$ is less than a threshold voltage required to turn "on" gate electrodes 30 or wherein $V_G$ is substantially equal to the ground potential or the reference potential for device 10. Under this condition, gate electrodes 30 are said to be turned "off". Upper electrodes 46 can be held at a voltage $V_A$, wherein $V_A$ is substantially equal to the ground potential or the reference potential for device 10. A voltage $V_B$ can be applied to lower electrode 50. As an example, voltage $V_B$ can be approximately 30V above the ground potential or the reference potential for device 10. Body regions 40 can be held at the ground potential. Alternatively, body regions 40 can be held at a voltage substantially equal to $V_A$ by connecting the body electrode to a control circuit, which electrically connects it to upper electrode 46. Under this second example, device 10 can conduct little to no current from lower electrode 50 to upper electrode 46.

In a third example, a voltage $V_G$ can be applied to gate electrodes 30. The value of voltage $V_G$ can be chosen such that upon application of $V_G$ to gate electrodes 30, inversion layers are formed in portions of body regions 40 adjacent to gate layers 262. Under this condition, gate electrodes 30 are said to be turned "on". Lower electrode 50 can be held at a voltage $V_B$, wherein $V_B$ is substantially equal to the ground potential or the reference potential for device 10. A voltage $V_A$ can be applied to upper electrodes 46. As an example, voltage $V_A$ can be approximately 30V above the ground potential or the reference potential for device 10. Body regions 40 can be held at the ground potential. Alternatively, body regions 40 can be held at a voltage substantially equal to $V_B$ by connecting the body electrode to a control circuit, which electrically connects it to lower electrode 50. Under this third example, device 10 can conduct a current from upper electrodes 46 to lower electrode 50.

In a fourth example, gate electrodes 30 can be held at a voltage $V_G$, wherein $V_G$ is less than a threshold voltage required to turn "on" gate electrodes 30 or wherein $V_G$ is substantially equal to the ground potential or the reference potential for device 10. Under this condition, gate electrodes 30 are said to be turned "off". Lower electrode 50 can be held at a voltage $V_B$, wherein $V_B$ is substantially equal to the ground potential or the reference potential for device 10. A voltage $V_A$ can be applied to upper electrodes 46. As an example, voltage $V_A$ can be approximately 30V above the ground potential or reference potential for device 10. Body regions 40 can be held at the ground potential. Alternatively, body regions 40 can be held at a voltage substantially equal to $V_B$ by connecting the body electrode to a control circuit, which electrically connects it to lower electrode 50. Under this fourth example, device 10 can conduct little to no current from upper electrodes 46 to lower electrode 50.

In accordance with the present embodiment, device 10 comprises a monolithic bi-directional FET and is capable of both conducting and blocking current in two directions as demonstrated by the above four examples.

Figure 11:
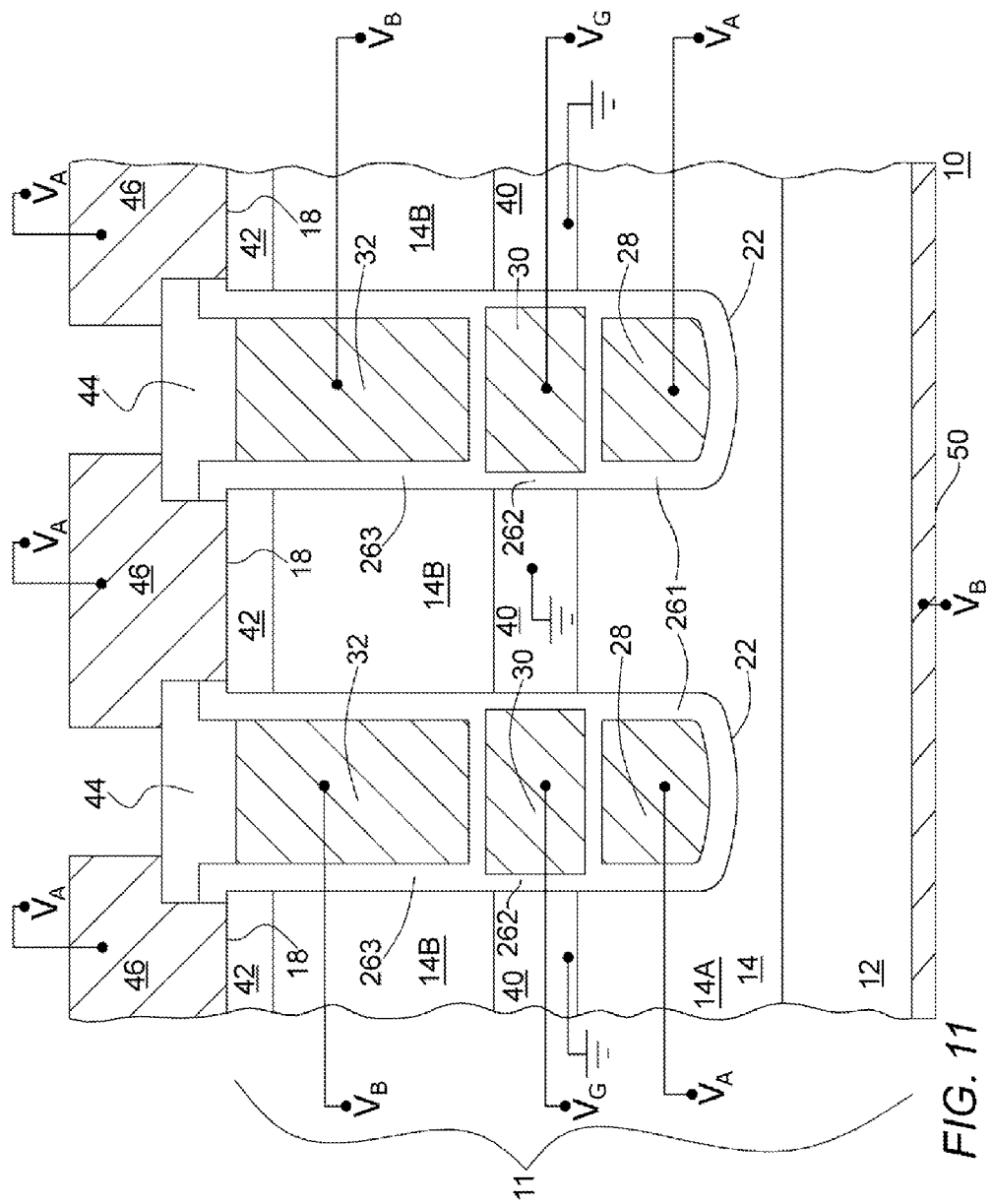
FIG. 11 illustrates a partial cross-sectional view of an alternative embodiment of a semiconductor device at a stage of fabrication in accordance with a third embodiment of the present invention.

Referring now to FIG. 11, in one embodiment, the operation of device 10 can proceed as follows. A voltage $V_A$ can be applied to shield electrodes 28 and upper electrodes 46. A voltage $V_B$ can be applied to shield electrodes 32 and lower electrode 50. Body regions 40 can be left at a floating potential or can be held at a ground potential or a reference potential for device 10. In this configuration, device 10 is configured to conduct or block current in two directions depending on the relative voltage values selected for voltages $V_A$, $V_B$, and $V_G$.

In a first example, a voltage $V_G$ can be applied to gate electrodes 30. The value of voltage $V_G$ is chosen such that upon application of $V_G$ to gate electrodes 30, inversion layers are formed in portions of body regions 40 adjacent to gate layers 262. Under this condition, gate electrodes 30 are said to be turned "on". Upper electrodes 46 and shield electrodes 28 can be held at a voltage $V_A$, wherein $V_A$ is substantially equal to the ground potential or the reference potential for device 10. A voltage $V_B$ can be applied to lower electrode 50 and shield electrodes 32. As an example, voltage $V_B$ can be approximately 30V above the ground potential or the reference potential for device 10. Body regions 40 can be held at the ground potential. Alternatively, body regions 40 can be held at a voltage substantially equal to $V_A$ by connecting the body electrode to a control circuit, which electrically connects it to upper electrode 46. Under this first example, device 10 can conduct a current from lower electrode 50 to upper electrodes 46.

In a second example, gate electrodes 30 can be held at a voltage $V_G$, wherein $V_G$ is less than a threshold voltage required to turn "on" gate electrodes 30 or wherein $V_G$ is substantially equal to the ground potential or the reference potential for device 10. Under this condition, gate electrodes 30 are said to be turned "off". Upper electrodes 46 and shield electrodes 28 can be held at a voltage $V_A$, wherein $V_A$ is substantially equal to the ground potential or the reference potential for device 10. A voltage $V_B$ can be applied to lower electrode 50 and shield electrodes 32. As an example, $V_B$ can be approximately 30V above the ground potential or the reference potential for device 10. Body regions 40 can be held at the ground potential. Alternatively, body regions 40 can be held at a voltage substantially equal to $V_A$ by connecting the body electrode to a control circuit, which electrically connects it to upper electrode 46. Under this second example, device 10 can conduct little to no current from lower electrode 50 to upper electrode 46.

In a third example, a voltage $V_G$ can be applied to gate electrodes 30. The value of voltage $V_G$ can be chosen such that upon application of $V_G$ to gate electrodes 30, inversion layers are formed in portions of body regions 40 adjacent to gate layers 262. Under this condition, gate electrodes 30 are said to be turned "on". Lower electrode 50 and shield electrodes 32 can be held at a voltage $V_B$, wherein $V_B$ is substantially equal to the ground potential or the reference potential for device 10. A voltage $V_A$ can be applied to upper electrodes 46 and shield electrodes 28. As an example, $V_A$ can be approximately 30V above the ground potential or reference potential for device 10. Body regions 40 can be held at the ground potential. Alternatively, body regions 40 can be held at a voltage substantially equal to $V_B$ by connecting the body electrode to a control circuit, which electrically connects it to lower electrode 50. Under this third example, device 10 can conduct a current from upper electrodes 46 to lower electrode 50.

In a fourth example, can be held at a voltage $V_G$, wherein $V_G$ is less than a threshold voltage required to turn "on" gate electrodes 30 or wherein $V_G$ is substantially equal to the ground potential or the reference potential for device 10. Under this condition, gate electrodes 30 are said to be turned "off". Lower electrode 50 and shield electrodes 32 can be held at a voltage $V_B$, wherein $V_B$ is substantially equal to the ground potential or the reference potential for device 10. A voltage $V_A$ can be applied to upper electrodes 46 and shield electrodes 28. As an example, voltage $V_A$ can be approximately 30V above the ground potential or the reference potential for device 10. Body regions 40 can be held at the ground potential. Alternatively, body regions 40 can be held at a voltage substantially equal to $V_B$ by connecting the body electrode to a control circuit, which electrically connects it to lower electrode 50. Under this fourth example, device 10 can conduct little to no current from upper electrodes 46 to lower electrode 50.

In accordance with the present embodiment, device 10 comprises a monolithic bi-directional FET and is capable of both conducting and blocking current in two directions as demonstrated by the above four examples.

Shield electrodes 28 and 32, as shown in FIGS. 10 and 11, are configured to control the width of the depletion layer between body regions 40 and lower portions 14A of semiconductor layer 14, and to control the width of the depletion layer between body regions 40 and upper portions 14B of semiconductor layer 14, depending on the bias conditions. This enhances the breakdown voltage ($BV_{DSS}$) of device 10. The presence of shield electrodes 28 and 32 in device 10 allow upper and lower portions 14A and 14B of semiconductor layer 14 to be doped at a heavier doping concentration for a device with a given breakdown voltage ($BV_{DSS}$) than would be feasible for a device having the same breakdown voltage ($BV_{DSS}$) but lacking shield electrodes 28 and 32. The relatively heavier doping concentration of upper and lower portions 14A and 14B of semiconductor layer 14 is desirable because it reduces the "on" resistance (RDs) of device 10. In addition, shield electrodes 28 and 32 help to reduce gate-to-drain capacitance of device 10, which in the case of device 10 could be described as either a gate-to-upper electrode capacitance or a gate-to-lower electrode capacitance, depending on the bias conditions.

Figure 12:
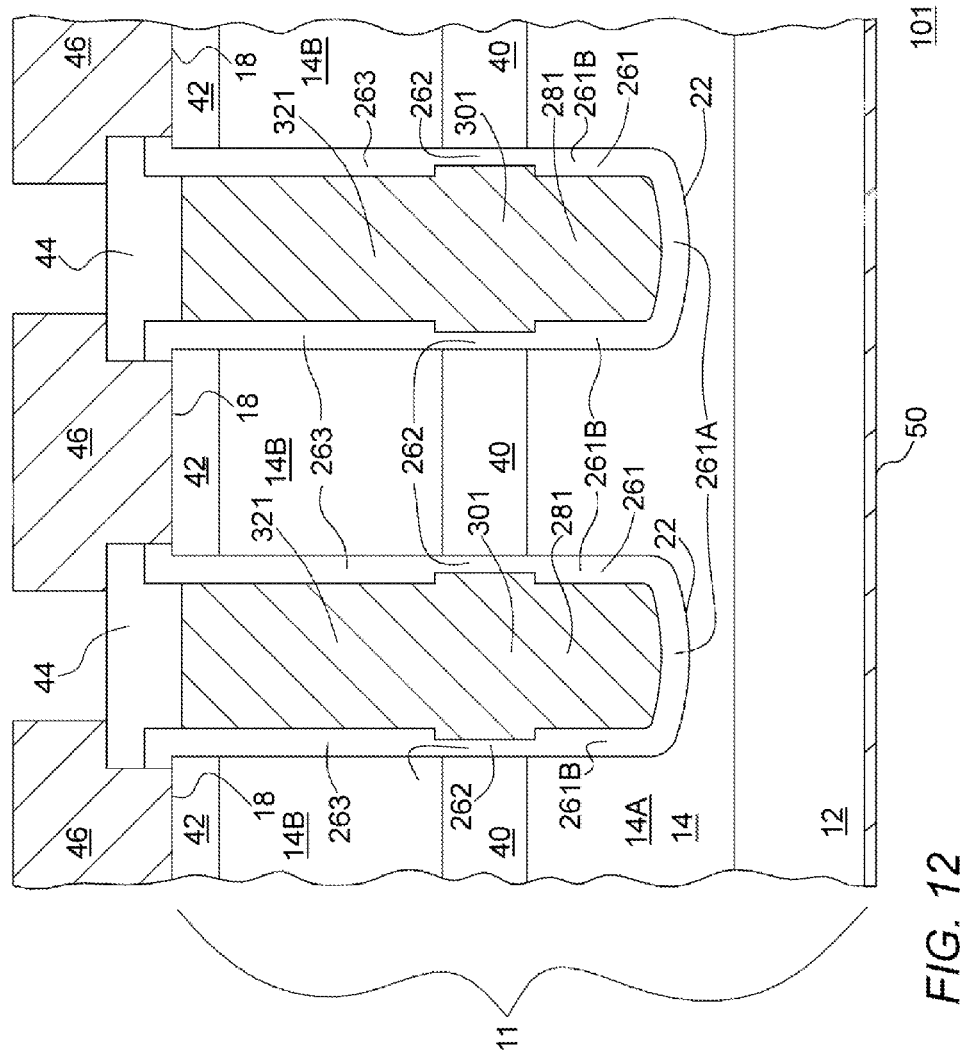
FIG. 12 illustrates a partial cross-sectional view of an alternative embodiment of a semiconductor device at a stage of fabrication in accordance with a fourth embodiment of the present invention.

FIG. 12 illustrates a partial cross-sectional view of an alternative embodiment of a semiconductor device 101 at a stage of fabrication in accordance with another embodiment. The formation of device 101 in this figure is similar to the formation of device 10 in FIGS. 1-9. Here, the shield electrodes 321 and 281 are connected, at least in part, to gate electrodes 301. This configuration can be accomplished, for example, with additional masking and etching steps to remove dielectric material overlying shield electrode 281 before gate electrode 301 is formed, and to remove dielectric material overlying gate electrode 301 before shield electrode 321 is formed.

The operation of device 101 is similar to the operation of device 10 as described in FIG. 10, except that shield electrodes 321 and 281 are electrically connected to gate electrode 301. Thus, when gate electrode 301 is turned "off", shield electrodes 321 and 281 are effectively grounded and behave similar to shield electrodes 32 and 28 in FIG. 10, which can be grounded or held at a reference potential. When gate electrode 301 is "on", a voltage $V_G$ is applied to shield electrodes 281 and 321 since they are electrically connected to gate electrode 301. However, the voltage $V_G$ applied to shield electrodes 281 and 321 can cause an accumulation layer to be formed adjacent the sidewalls of the trench. This accumulation layer results in a lower "on" resistance for device 101. Furthermore, the accumulation layer can also affect the gate-to-drain capacitance for device 101.

Figure 13:
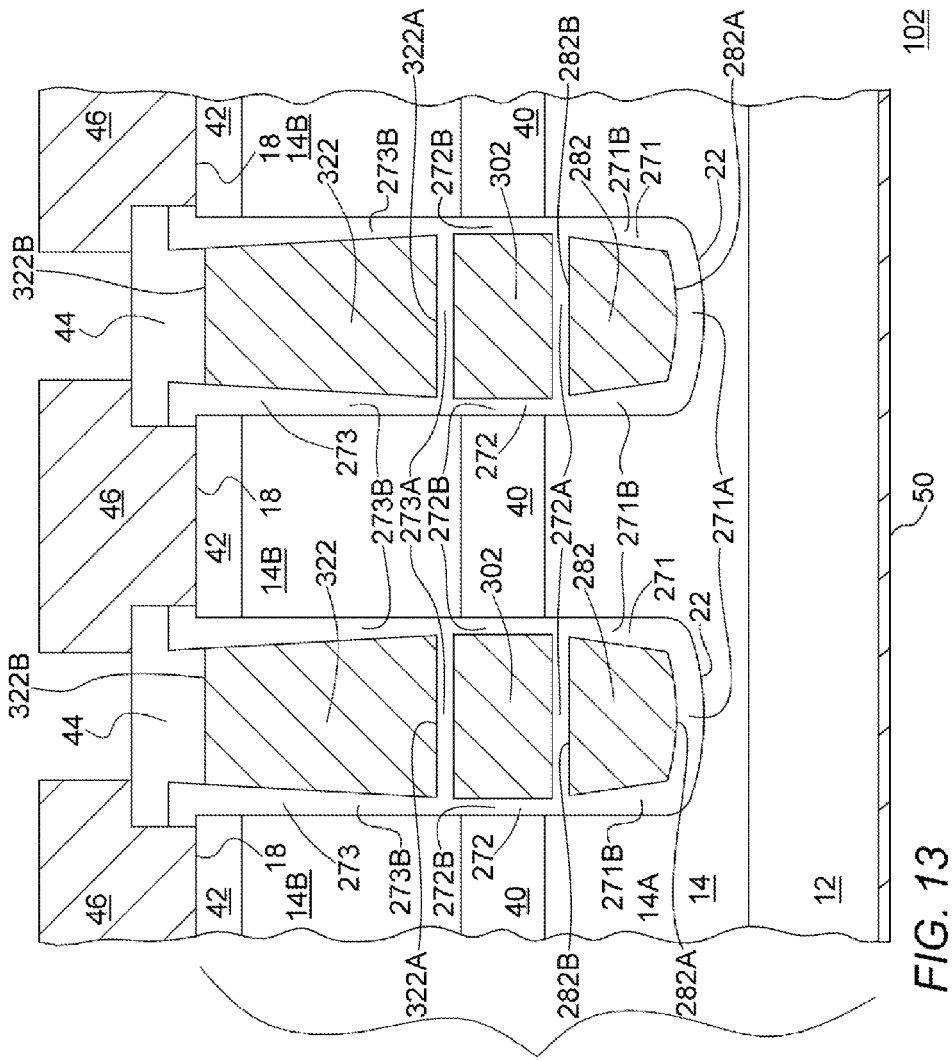
FIG. 13 illustrates a partial cross-sectional view of an alternative embodiment of a semiconductor device at a stage of fabrication in accordance with a fifth embodiment of the present invention.

FIG. 13 illustrates a partial cross-sectional view of an alternative embodiment of a semiconductor device 102 at a stage of fabrication in accordance with another embodiment. The formation of device 102 in this figure is similar to the formation of device 10 in FIGS. 1-9, however, additional sacrificial layers, masking and etching steps and other fabrication techniques known to those skilled in the art may be required to form the tapered dielectric layers and shield electrodes described hereinafter. In this embodiment, dielectric layers 271B have a thickness that varies from the lower surface 282A of shield electrodes 282 to the upper surface 282B of shield electrodes 282. Dielectric layers 271B are thicker near the lower surface 282A of shield electrodes 282 and thinner near the upper surface 282B of shield electrodes 282. Furthermore, shield electrodes 282 have a tapered width such that the width of shield electrodes 282 at their lower surfaces 282A is less than the width of shield electrodes 282 at their upper surfaces 282B. Furthermore, dielectric layers 273B have a thickness that varies from the lower surface 322A of shield electrodes 322 to the upper surface 322B of shield electrodes 322. Dielectric layers 273B are thinner near the lower surface 322A of shield electrodes 322 and thicker near the upper surface 322B of shield electrodes 322. Furthermore, shield electrodes 322 have a tapered width such that the width of shield electrodes 322 at their lower surfaces 322A is greater than the width of shield electrodes 322 at their upper surfaces 322B.

The operation of device 102 is similar to the operation of device 10 as described in FIG. 10 and FIG. 11 above. However, the use of tapered shield electrodes 282 and 322 provides the additional advantage of a more uniform electric field in lower portions 14A and upper portions 14B of semiconductor layer 14.

Figure 14:
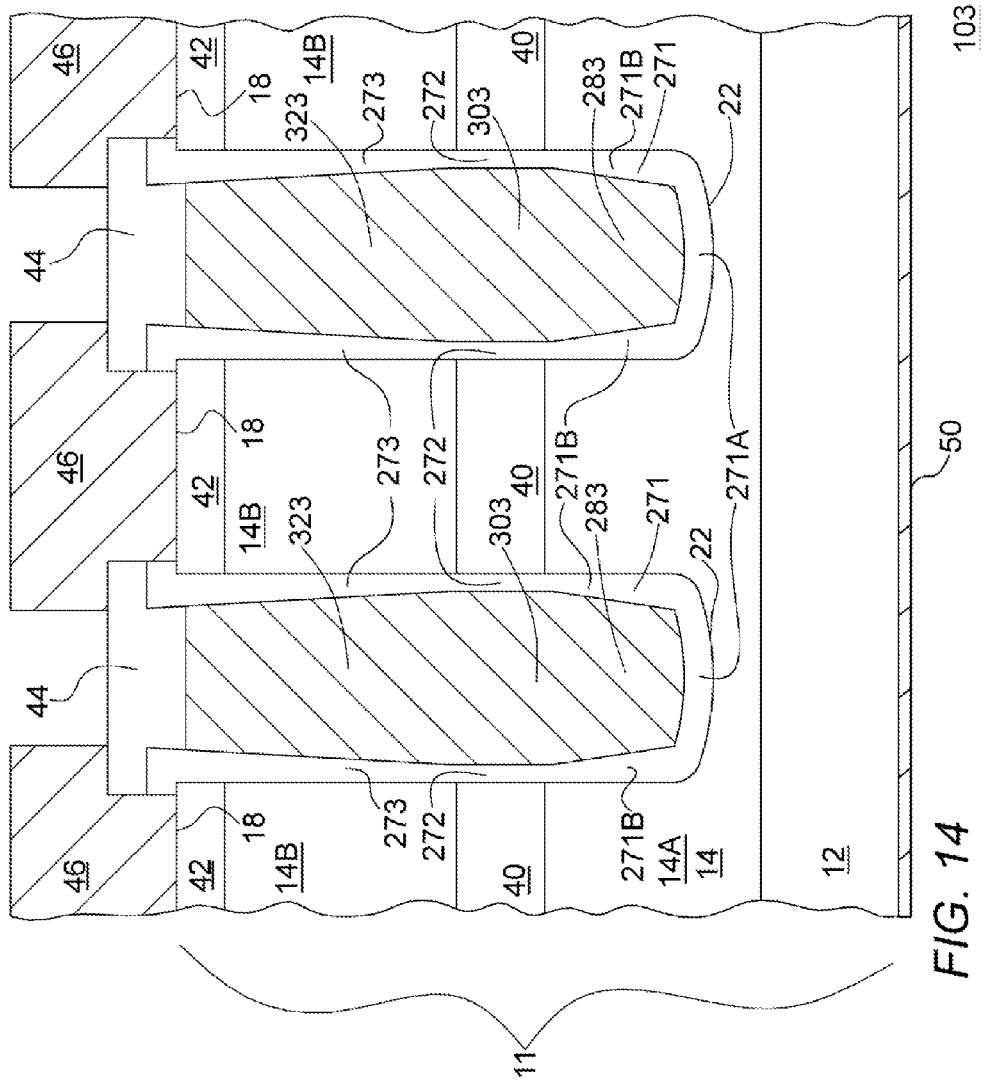
FIG. 14 illustrates a partial cross-sectional view of an alternative embodiment of a semiconductor device at a stage of fabrication in accordance with a sixth embodiment of the present invention.

FIG. 14 illustrates a partial cross-sectional view of an alternative embodiment of a semiconductor device 103 at a stage of fabrication in accordance with another embodiment. The formation of device 103 in this figure is similar to the formation of device 10 and in FIGS. 1-9 and device 102 in FIG. 11. Here, the shield electrodes 323 and 283 are connected, at least in part, to gate electrode 303. This configuration can be accomplished with additional masking and etching steps to remove dielectric material overlying shield electrode 283 before gate electrode 303 is formed, and to remove dielectric material overlying gate electrode 303 before shield electrode 323 is formed.

The operation of device 103 is similar to the operation of device 102 as described in FIG. 13, except that shield electrodes 323 and 283 are electrically connected to gate electrode 301. Thus, when gate electrode 303 is turned "off", shield electrodes 323 and 283 are effectively grounded and behave similar to shield electrodes 322 and 282 in FIG. 13, which can be grounded or held at a reference potential. When gate electrode 303 is "on", a voltage $V_G$ is applied to shield electrodes 283 and 323 since they are electrically connected to gate electrode 303. However, the voltage $V_G$ applied to shield electrodes 283 and 323 can cause an accumulation layer to be formed adjacent the sidewalls of the trench. This accumulation layer results in a lower "on" resistance for device 103. Furthermore, the accumulation layer can also affect the gate-to-drain capacitance for device 103.

Figure 15:
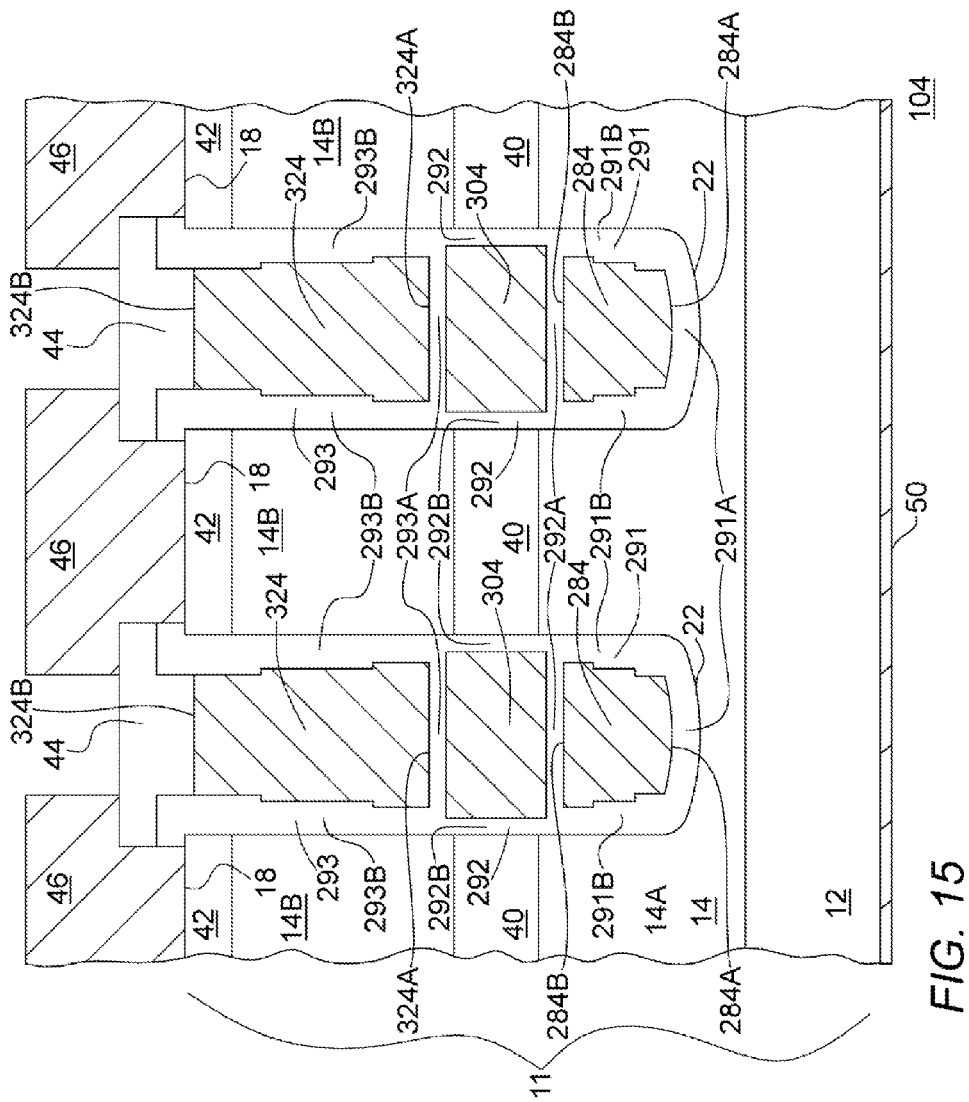
FIG. 15 illustrates a partial cross-sectional view of an alternative embodiment of a semiconductor device at a stage of fabrication in accordance with a seventh embodiment of the present invention.

FIG. 15 illustrates a partial cross-sectional view of an alternative embodiment of a semiconductor device 104 at a stage of fabrication in accordance with another embodiment. The formation of device 104 in this figure is similar to the formation of device 10 in FIGS. 1-9. Here, dielectric layers 291B have a thickness that varies from the lower surface 284A of shield electrodes 284 to the upper surface 284B of shield electrodes 284. Dielectric layers 291B are thicker near the lower surface 284A of shield electrodes 284 and thinner near the upper surface 284B of shield electrodes 284. Furthermore, shield electrodes 284 have a stepped width such that the width of shield electrodes 284 at their lower surfaces 284A is less than the width of shield electrodes 284 at their upper surfaces 284B. The number of "steps" on shield electrodes 284 is not intended as a limitation, thus, shield electrodes 284 can comprise one or multiple steps. Furthermore, dielectric layers 293 have a thickness that varies from the lower surface 324A of shield electrodes 324 to the upper surface 324B of shield electrodes 324. Dielectric layers 293 are thinner near the lower surface 324A of shield electrodes 324 and thicker near the upper surface 324B of shield electrodes 324. Furthermore, shield electrodes 324 have a stepped width such that the width of shield electrodes 324 at their lower surfaces 324A is greater than the width of shield electrodes 324 at their upper surfaces 324B. The number of "steps" on shield electrodes 324 is not intended as a limitation, thus, shield electrodes 324 may comprise one or multiple steps. This embodiment can be accomplished by the addition of extra masking and etching steps to the process of forming device 10 as described in FIGS. 1-9. The stepped shield electrodes 324 and 284 are formed by masking and etching each individual "step" during the formation of dielectric layer 291B and 293 and during the formation of shield electrodes 284 and 324.

The operation of device 104 is similar to the operation of devices 10 and 102 as described in FIG. 10, FIG. 11 and FIG. 13 above. However, the use of stepped shield electrodes 324 and 284 provides the additional advantage of a more uniform electric field in lower portions 14A and upper portions 14B of semiconductor layer 14.

Figure 16:
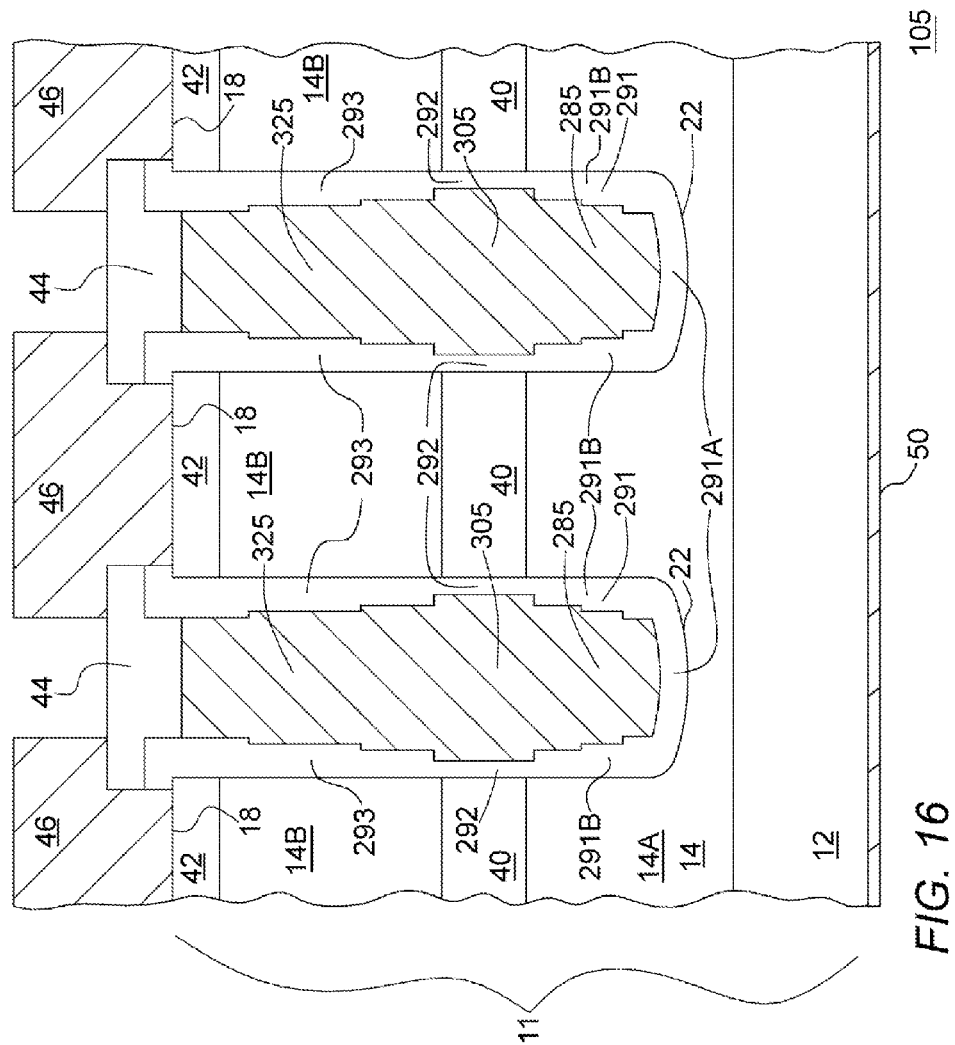
FIG. 16 illustrates a partial cross-sectional view of an alternative embodiment of a semiconductor device at a stage of fabrication in accordance with an eighth embodiment of the present invention.

FIG. 16 illustrates a partial cross-sectional view of an alternative embodiment of a semiconductor device 105 at a stage of fabrication in accordance with another embodiment. The formation device 105 in this figure is similar to the formation of device 10 and in FIGS. 1-9 and device 104 in FIG. 13. Here, shield electrodes 325 and 285 are connected, at least in part, to gate electrode 305. This configuration can be accomplished with additional masking and etching steps to remove dielectric material overlying shield electrode 285 before gate electrode 305 is formed, and to remove dielectric material overlying gate electrode 305 before shield electrode 325 is formed.

The operation of device 105 is similar to the operation of device 104 as described in FIG. 15, except that shield electrodes 325 and 285 are electrically connected to gate electrode 305. Thus, when gate electrode 305 is turned "off", shield electrodes 325 and 285 are effectively grounded and behave similar to shield electrodes 324 and 284 in FIG. 15, which can be grounded or held at a reference potential. When gate electrode 305 is "on", a voltage $V_G$ is applied to shield electrodes 285 and 325 since they are electrically connected to gate electrode 305. However, the voltage $V_G$ applied to shield electrodes 285 and 325 can cause an accumulation layer to be formed adjacent the sidewalls of the trench. This accumulation layer results in a lower "on" resistance for device 105. Furthermore, the accumulation layer can also affect the gate-to-drain capacitance for device 105.

From all the foregoing, one skilled in the art can determine that according to one embodiment, a semiconductor device includes a region of semiconductor material of a first conductivity type having a major surface and a trench extending into the region of semiconductor material from the major surface. The device includes an insulator layer formed within the trench and adjacent sidewall surfaces of the trench. The device includes a first shield electrode in a bottom portion of the trench and overlying a portion of the insulator and separated from the sidewall surfaces of the trench by the insulator layer. The device includes a gate electrode in the trench, overlying the first shield electrode and separated from the sidewall surfaces of the trench by the insulator layer. The device includes a second shield electrode within the trench, overlying the gate electrode and separated from the sidewall surfaces of the trench by the insulator layer. The device includes a body region of a second conductivity type formed within the region of semiconductor material, adjacent the gate electrode and separated from the gate electrode by the gate layer, and spaced apart from the major surface.

Those skilled in the art will also appreciate that according to another embodiment, a semiconductor device includes a region of semiconductor of a first conductivity type having a major surface and a trench extending into the region of semiconductor material from the major surface. The device includes a first shield electrode in a bottom portion of the trench. The first shield electrode is insulated from the region of semiconductor material by a first dielectric layer. The device includes a gate electrode in the trench. The gate electrode overlies the first shield electrode and is insulated from the first shield electrode by a second dielectric layer. The gate electrode is insulated from the region of semiconductor material by a third dielectric layer. The device includes a second shield electrode in the trench. The second shield electrode overlies the gate electrode and is insulated from the gate electrode by a fourth dielectric layer. The second shield electrode is insulated from the region of semiconductor material by a fifth dielectric layer. The device includes a body region of a second conductivity type formed within the region of semiconductor material, adjacent the gate electrode, separated from the gate electrode by the gate layer, and spaced apart from the major surface. The device includes a contact region of semiconductor material of the first conductivity type near the major surface of the region of semiconductor material and within the region of semiconductor material.

Those skilled in the art will also appreciate that according to another embodiment, a method of forming a semiconductor device includes the acts of providing a region of semiconductor material of a first conductivity type having a major surface. The method includes forming a trench extending into the region of semiconductor material from the major surface. The method includes forming a first shield dielectric layer in the trench and adjacent a portion of sidewall surfaces within the trench. The method includes forming a first shield electrode in the trench which overlies the first shield dielectric layer and is separated from the sidewall surfaces of the trench by the first shield dielectric layer. The method includes forming a gate dielectric layer in the trench and adjacent a portion of sidewall surfaces within the trench. The method includes forming a gate electrode in the trench which overlies the first shield electrode and is separated from the sidewall surfaces of the trench by the gate dielectric layer. The method includes forming a second shield dielectric layer in the trench and adjacent a portion of sidewall surfaces within the trench. The method includes forming a second shield electrode in the trench which overlies the gate electrode and is separated from the sidewall surfaces of the trench by the second shield dielectric layer. The method includes forming a body region within the region of semiconductor material, adjacent the gate electrode, separated from the gate electrode by the gate dielectric layer, and spaced apart from the major surface.

While the subject matter of the invention is described with specific preferred embodiments and example embodiments, the foregoing drawings and descriptions thereof depict only typical embodiments of the subject matter, and are not therefore to be considered limiting of its scope. It is evident that many alternatives and variations will be apparent to those skilled in the art. For example, the subject matter has been described for a particular n-channel MOSFET structure, although the method and structure is directly applicable to other MOS transistors.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as one or more embodiments of the invention. Furthermore, while some embodiments described herein include some but not other features included in other embodiments, combinations of features of different embodiments are meant to be within the scope of the invention, and form different embodiments, as would be understood by those skilled in the art.

We claim:

1. A semiconductor device comprising:
   a region of semiconductor material of a first conductivity type having a major surface;
   a trench extending into the region of semiconductor material from the major surface;
   a first dielectric layer formed within the trench and adjacent sidewall surfaces of the trench, wherein the first dielectric layer comprises a first shield layer, a gate layer and a second shield layer;
   a first shield electrode in a bottom portion of the trench and overlying a portion of the first dielectric layer and spaced apart from the sidewall surfaces of the trench by the first shield layer;
   a gate electrode in the trench and overlying the first shield electrode and spaced apart from the sidewall surfaces of the trench by the gate layer;
   a second shield electrode in the trench and overlying the gate electrode and spaced apart from the sidewall surfaces of the trench by the second shield layer;
   a body region of a second conductivity type formed within the region of semiconductor material, adjacent the gate electrode and spaced apart from the gate electrode by the gate layer, and spaced apart from the major surface; and
   a lower electrode adjoining a portion of a lower surface of the region of semiconductor material of the first conductivity type and an upper electrode adjoining a portion of the major surface of the region of semiconductor material of the first conductivity type, wherein the second shield electrode is electrically connected to the lower electrode and wherein the first shield electrode is electrically connected to the upper electrode.

2. The device of claim 1, further comprising:
   a contact region of semiconductor material of the first conductivity type, the contact region of semiconductor material being proximate the major surface of the region of semiconductor material and within the region of semiconductor material.

3. The device of claim 1, wherein the doping concentration of the region of semiconductor material of a first conductivity type varies from a higher doping concentration at a base of the region of semiconductor material to a lower doping concentration at a midpoint of the region of semiconductor material to a higher doping concentration at the major surface of the region of semiconductor material.

4. The device of claim 1, wherein the thickness of the first shield layer and the thickness of the second shield layer are greater than the thickness of the gate layer.

5. The device of claim 1, wherein the thickness of the first shield layer tapers from a thicker portion at a lower surface of the first shield electrode to a thinner portion at an upper surface of the first shield electrode, and wherein the thickness of the second shield layer tapers from a thicker portion at an upper surface of the second shield electrode to a thinner portion at a lower surface of the second shield electrode.

6. A semiconductor device comprising:
   a region of semiconductor material of a first conductivity type having a major surface;

a trench extending into the region of semiconductor material from the major surface;

a first shield electrode in a bottom portion of the trench, the first shield electrode being insulated from a sidewall of the trench by a first dielectric layer, wherein a portion of the first dielectric layer has a first lateral thickness;

a gate electrode in the trench and overlying the first shield electrode, the gate electrode being insulated from the first shield electrode by a second dielectric layer, and wherein the gate electrode is insulated from the sidewall of the trench by a third dielectric layer, wherein a portion of the third dielectric layer has a second lateral thickness, and wherein the second lateral thickness is less than the first lateral thickness;

a second shield electrode in the trench and overlying the gate electrode, the second shield electrode being insulated from the gate electrode by a fourth dielectric layer, and wherein the second shield electrode is insulated from the sidewall of the trench by a fifth dielectric layer, wherein a portion of the fifth dielectric layer has a third lateral thickness, and wherein the third lateral thickness is greater than the second lateral thickness;

a body region of a second conductivity type formed within the region of semiconductor material of the first conductivity type and adjacent the gate electrode; and a contact region of semiconductor material of the first conductivity type, the contact region being near the major surface of the region of semiconductor material and within the region of semiconductor material.

7. The device of claim 6, wherein the first dielectric layer has a thickness that varies from a lower surface of the first shield electrode to an upper surface of the first shield electrode, the first dielectric layer being thicker at the lower surface of the first shield electrode than at the upper surface of the first shield electrode, and wherein the first shield electrode has a tapered width such that a width of the first shield electrode at its lower surface is less than a width of the first shield electrode at its upper surface, and wherein the fifth dielectric layer has a thickness that varies from a lower surface of the second shield electrode to an upper surface of the second shield electrode, the fifth dielectric layer being thinner at the lower surface of the second shield electrode than at the upper surface of the second shield electrode, and wherein the second shield electrode has a tapered width such that a width of the second shield electrode at its lower surface is greater than a width of the second shield electrode at its upper surface.

8. The device of claim 6, wherein the first dielectric layer has a thickness that varies in a stepped manner from a lower surface of the first shield electrode to an upper surface of the first shield electrode, the first dielectric layer being thicker at the lower surface of the first shield electrode than at the upper surface of the first shield electrode, and wherein the first shield electrode has a stepped width such that a width of the first shield electrode at its lower surface is less than a width of the first shield electrode at its upper surface, and wherein the fifth dielectric layer has a thickness that varies in a stepped manner from a lower surface of the second shield electrode to an upper surface of the second shield electrode, the fifth dielectric layer being thinner at the lower surface of the second shield electrode than at the upper surface of the second shield electrode, and wherein the second shield electrode has a stepped width such that a width of the second shield electrode at its lower surface is greater than a width of the second shield electrode at its upper surface.

9. A semiconductor device comprising:

a region of semiconductor material of a first conductivity type having a major surface;

a first trench and a second trench extending into the region of semiconductor material from the major surface;

a first dielectric layer formed within the first trench and adjacent sidewall surfaces of the first trench, wherein the first dielectric layer comprises a first shield layer, a first gate layer and a second shield layer;

a first shield electrode in a bottom portion of the first trench and overlying a portion of the first dielectric layer and spaced apart from the sidewall surfaces of the first trench by the first shield layer;

a first gate electrode in the first trench and overlying the first shield electrode and spaced apart from the sidewall surfaces of the first trench by the first gate layer;

a second shield electrode in the first trench and overlying the first gate electrode and spaced apart from the sidewall surfaces of the first trench by the second shield layer, wherein the first shield electrode, the first gate electrode and the second shield electrode form a single polysilicon structure;

a second dielectric layer formed within the second trench and adjacent sidewall surfaces of the second trench, wherein the second dielectric layer comprises a third shield layer, a second gate layer and a fourth shield layer;

a third shield electrode in a bottom portion of the second trench and overlying a portion of the third dielectric layer and spaced apart from the sidewall surfaces of the second trench by the third shield layer;

a second gate electrode in the second trench and overlying the third shield electrode and spaced apart from the sidewall surfaces of the second trench by the second gate layer;

a fourth shield electrode in the second trench and overlying the second gate electrode and spaced apart from the sidewall surfaces of the second trench by the fourth shield layer, wherein the third shield electrode, the second gate electrode and the third shield electrode form a single polysilicon structure; and a body region of a second conductivity type formed within the region of semiconductor material, adjacent the first gate electrode and adjacent the second gate electrode and spaced apart from the first gate electrode by the first gate layer and spaced apart from the second gate electrode by the second gate layer, and wherein the body region of the second conductivity type is spaced apart from the major surface, and wherein the body region of a second conductivity type divides the region of semiconductor material into an upper portion and a lower portion, wherein the upper portion is of the first conductivity type and extends across the region of semiconductor material between the first trench and the second trench, wherein the thickness of the first shield layer and the thickness of the second shield layer are greater than the thickness of the first gate layer.

10. The device of claim 9, wherein the thickness of the first shield layer tapers from a thicker portion at a lower surface of the first shield electrode to a thinner portion proximate to a point where the first shield electrode meets the first gate electrode, and wherein the thickness of the second shield layer tapers from a thicker portion at an upper surface of the second shield electrode to a thinner portion proximate to a point where the first gate electrode meets the second shield electrode.

11. The device of claim 9, wherein the thickness of the first shield layer decreases in a stepped manner from a thicker portion at a lower surface of the first shield electrode to a thinner portion proximate to a point where the first shield electrode meets the first gate electrode, and wherein the thickness of the second shield layer decreases in a stepped manner from a thicker portion at an upper surface of the second shield electrode to a thinner portion proximate to a point where the first gate electrode meets the second shield electrode.

* * * * *